(12) United States Patent
Glickman et al.

(10) Patent No.: US 10,426,029 B1
(45) Date of Patent: Sep. 24, 2019

(54) MICRO-PAD ARRAY TO THREAD FLEXIBLE ATTACHMENT

(71) Applicant: Flex Ltd., Singapore (SG)

(72) Inventors: Michael James Glickman, Mountain View, CA (US); Nicholas LeClerc, Roxbury Crossing, MA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/874,649

(22) Filed: Jan. 18, 2018

(51) Int. Cl.
*H05K 1/11* (2006.01)
*H05K 1/02* (2006.01)
*H05K 1/03* (2006.01)

(52) U.S. Cl.
CPC ............ *H05K 1/111* (2013.01); *H05K 1/028* (2013.01); *H05K 1/0326* (2013.01); *H05K 1/0346* (2013.01); *H05K 2201/0145* (2013.01); *H05K 2201/0154* (2013.01); *H05K 2201/0158* (2013.01); *H05K 2201/09409* (2013.01)

(58) Field of Classification Search
CPC ................................ H05K 1/111; H05K 1/028
USPC ......................................................... 174/254
See application file for complete search history.

(56) References Cited

U.S. PATENT DOCUMENTS

| | | | |
|---|---|---|---|
| 4,492,949 A | 1/1985 | Peterson et al. | |
| 4,774,530 A | 9/1988 | Hawkins | |
| 5,291,374 A | 3/1994 | Hirata | |
| 5,626,135 A | 5/1997 | Sanfilippo | |
| 5,739,254 A | 4/1998 | Fuller | |
| 5,761,809 A | 6/1998 | Fuller | |
| 5,762,812 A | 6/1998 | Narang | |
| 5,816,848 A | 10/1998 | Zimmerman | |
| 5,849,809 A | 12/1998 | Narang | |
| 5,863,963 A | 1/1999 | Narang | |
| 5,945,253 A | 8/1999 | Narang | |
| 5,958,995 A | 9/1999 | Narang | |
| 5,994,425 A | 11/1999 | Narang | |
| 6,007,877 A | 12/1999 | Narang | |
| 6,124,372 A | 9/2000 | Smith | |
| 6,139,920 A | 10/2000 | Smith | |
| 6,260,956 B1 | 7/2001 | Narang | |
| 6,302,523 B1 | 10/2001 | Smith | |
| 6,370,034 B1 * | 4/2002 | Busch ................. | H05K 1/0224 174/256 |
| 6,534,723 B1 * | 3/2003 | Asai .................. | H01L 23/49811 174/255 |
| 6,743,982 B2 | 6/2004 | Biegelson | |
| 6,964,205 B2 | 11/2005 | Papakostas et al. | |
| 7,456,571 B1 * | 11/2008 | Wedding .............. | H01J 11/18 313/582 |
| 7,491,892 B2 | 2/2009 | Wagner | |
| 7,578,195 B2 | 8/2009 | DeAngelis et al. | |
| 7,629,691 B2 | 12/2009 | Roush | |
| 7,795,540 B2 | 9/2010 | Yamada | |

(Continued)

OTHER PUBLICATIONS

Notice of Allowance dated Feb. 26, 2018, U.S. Appl. No. 14/995,139, filed Jan. 13, 2016, Applicant: Pui Yin Ye; 10 pages.

*Primary Examiner* — Timothy J Thompson
*Assistant Examiner* — Charles Pizzuto
(74) *Attorney, Agent, or Firm* — Haverstock & Owens LLP

(57) ABSTRACT

A micro-pad array to conductive wire flexible attachment assembly includes a micro-pad geometry formed on a flexible printed circuit and a method for connecting a conductive wire, thread or fiber to the micro-pad geometry.

21 Claims, 4 Drawing Sheets

(56) References Cited

U.S. PATENT DOCUMENTS

| | | | |
|---|---|---|---|
| 8,207,473 | B2 | 6/2012 | Axisa |
| 9,018,532 | B2 | 4/2015 | Wesselmann |
| 9,340,003 | B2 | 5/2016 | Chang |
| 10,117,328 | B1* | 10/2018 | Zhong .................. H05K 1/028 |
| 2002/0018042 | A1 | 2/2002 | Albert |
| 2003/0227079 | A1 | 12/2003 | Chia |
| 2004/0094835 | A1 | 6/2004 | Maghribi |
| 2004/0243204 | A1 | 12/2004 | Maghribi |
| 2004/0256725 | A1 | 12/2004 | Inoue |
| 2005/0110406 | A1 | 5/2005 | Jeong |
| 2005/0122700 | A1* | 6/2005 | Kim .................. H05K 1/028 |
| | | | 361/795 |
| 2007/0096260 | A1 | 5/2007 | Eshun |
| 2007/0215883 | A1 | 9/2007 | Dixon |
| 2008/0018611 | A1 | 1/2008 | Serban |
| 2008/0044127 | A1* | 2/2008 | Leising .............. G02B 6/12004 |
| | | | 385/14 |
| 2008/0139953 | A1 | 6/2008 | Baker |
| 2009/0108270 | A1 | 4/2009 | Chen |
| 2009/0257166 | A1 | 10/2009 | Kim |
| 2009/0272197 | A1 | 11/2009 | Ridao Granado et al. |
| 2010/0014265 | A1 | 1/2010 | Sagisaka |
| 2010/0037497 | A1 | 2/2010 | Anelevitz et al. |
| 2010/0063365 | A1 | 3/2010 | Pisani et al. |
| 2010/0107770 | A1 | 5/2010 | Serban |
| 2010/0160762 | A1 | 6/2010 | McLaughlin |
| 2010/0185076 | A1 | 7/2010 | Jeong et al. |
| 2011/0067904 | A1 | 3/2011 | Aoyama |
| 2011/0114376 | A1* | 5/2011 | Shoji .................. H05K 1/162 |
| | | | 174/258 |
| 2011/0180306 | A1 | 7/2011 | Naganuma |
| 2011/0180307 | A1 | 7/2011 | Naganuma |
| 2011/0194262 | A1 | 8/2011 | Naganuma |
| 2011/0198111 | A1 | 8/2011 | Naganuma |
| 2011/0199739 | A1 | 8/2011 | Naganuma |
| 2011/0203837 | A1 | 8/2011 | Naganuma |
| 2012/0052268 | A1 | 3/2012 | Axisa et al. |
| 2013/0019383 | A1 | 1/2013 | Korkala et al. |
| 2013/0038545 | A1 | 2/2013 | Hsu |
| 2013/0060115 | A1 | 3/2013 | Gehman et al. |
| 2013/0176737 | A1 | 7/2013 | Zhou et al. |
| 2013/0220535 | A1 | 8/2013 | Lee |
| 2013/0270528 | A1 | 10/2013 | Lee |
| 2014/0124245 | A1* | 5/2014 | Lai .................. H05K 1/184 |
| | | | 174/251 |
| 2014/0190727 | A1* | 7/2014 | Lee .................. H05K 1/0204 |
| | | | 174/252 |
| 2014/0209690 | A1 | 7/2014 | Teng et al. |
| 2014/0343390 | A1 | 11/2014 | Berzowska et al. |
| 2015/0065840 | A1 | 3/2015 | Bailey |
| 2015/0187863 | A1 | 7/2015 | Zhu |
| 2015/0261057 | A1 | 9/2015 | Harris |
| 2015/0366504 | A1 | 12/2015 | Connor |
| 2016/0007468 | A1 | 1/2016 | Tomikawa |
| 2016/0165723 | A1* | 6/2016 | Romero ............ H01L 23/49827 |
| | | | 257/774 |
| 2016/0183372 | A1* | 6/2016 | Park .................. H05K 1/0292 |
| | | | 174/262 |
| 2017/0108459 | A1 | 4/2017 | Katsuki |
| 2017/0150602 | A1 | 5/2017 | Johnston |
| 2017/0172421 | A1 | 6/2017 | Dabby et al. |
| 2017/0358841 | A1* | 12/2017 | Chen .................. H01Q 1/241 |
| 2017/0365644 | A1 | 12/2017 | Zheng et al. |
| 2018/0020563 | A1 | 1/2018 | Hong |
| 2018/0070446 | A1* | 3/2018 | Takahashi ............ H05K 1/0283 |

\* cited by examiner

MICRO-PAD ARRAY TO THREAD FLEXIBLE ATTACHMENT

FIELD OF THE INVENTION

The present invention is generally directed to conductive interconnects. More specifically, the present invention is directed to conductive interconnects between a conductive thread or fiber and a flexible printed circuit.

BACKGROUND OF THE INVENTION

Electronic devices are increasingly being developed that are able to bend, flex and twist, such as in wearable electronics. These mechanical requirements present reliability challenges on mechanical components, circuit boards and interconnects, as well as electronic components. In order to limit the stress and strain to these components while still maintaining flexibility, mechanical provisions must be put in place.

Flexible printed circuits (FPC) provide circuit board structures that are less rigid than earlier generation printed circuit boards, and enable varying degrees of flexing, bending and twisting. Flexible interconnects between conductive wires and FPCs are needed for applications where durability and flexibility are a concern.

In conventional structures, an interconnection is made between the conductive wire and the FPCs by first forming a bond pad on a top, outer surface of the FPC and then attaching an end of the conductive wire to the bond pad, typically using solder or conductive adhesive. The bond bad is a continuous layer of conductive material, typically formed as a square or circle. In this manner, the interconnection is made according to a one-to-one structural relationship between the end of the conducive wire and a single bond pad. However, traditional solder and conductive adhesive connections formed in such a structure are rigid and cause stress concentrations.

SUMMARY OF THE INVENTION

A micro-pad array-to-conductive wire flexible attachment assembly includes a micro-pad geometry formed on a FPC and a method for connecting a conductive wire, thread or fiber to the micro-pad geometry. This micro-pad geometry and connection method enhances durability and flexibility of the interconnection to improve electronics performance in many applications.

In an aspect, a flexible attachment assembly is disclosed. The flexible attachment assembly includes a flexible substrate, an electrically conductive connection area coupled to the flexible substrate, a plurality of electrically conductive micro-pads, and a conductive wire. Each electrically conductive micro-pad has a first end and a second end opposite the first end, the first end is connected to the electrically conductive connection area such that the electrically conductive connection area electrically interconnects all electrically conductive micro-pads. A portion of the conductive wire is mechanically and electrically coupled to the second end of one or more of the plurality of electrically conductive micro-pads. In some embodiments, the flexible substrate comprises one or more non-conductive layers and one or more conductive layers. In some embodiments, the flexible substrate comprises one of polyimide, polyethylene teraphthalate (PET), polyethylene nitride (PEN) or polyurethane. In some embodiments, the flexible substrate comprises a flexible printed circuit. In some embodiments, the electrically conductive connection area comprises a continuous layer of conductive material. In some embodiments, the continuous layer of conductive material comprises a metal foil sheet. In some embodiments, the plurality of electrically conductive micro-pads are made of conductive paste. In some embodiments, the conductive paste comprises one of a solder paste and an anisotropic conductive paste. In some embodiments, each of the plurality of electrically conductive micro-pads is physically separated from each other. In some embodiments, the flexible attachment assembly further comprises solder coupled to the portion of the electrically conductive wire and the first end of each of the electrically conductive micro-pads. In some embodiments, the flexible attachment assembly further comprises electrically conductive adhesive coupled to the portion of the electrically conductive wire and the first end of each of the electrically conductive micro-pads. In some embodiments, the flexible attachment assembly further comprises an insulating layer applied over the flexible substrate and the electrically conductive connection area and in-between the plurality of micro pads extending from the electrically conductive connection area. In some embodiments, the insulating layer comprises soldermask. In some embodiments, an outer surface of the insulating layer is co-planar with an exposed surface of the second end of each micro-pad. In some embodiments, the flexible substrate comprises a first surface and a second surface opposite the first surface, further wherein the electrically conductive connection area is connected to the first surface of the flexible substrate. In some embodiments, the flexible substrate comprises a first surface and a second surface opposite the first surface, further wherein a cavity is formed in the first surface of the flexible substrate and the electrically conductive connection area is positioned within the cavity. In some embodiments, the electrically conductive connection area has a first surface and a second surface opposite the first surface, further wherein the first surface of the electrically conductive connection area is connected to a bottom surface of the cavity, and the second surface of the electrically conductive connection area is co-planar with the first surface of the flexible substrate. In some embodiments, the electrically conductive connection area has a first surface and a second surface opposite the first surface, further wherein the first surface of the electrically conductive connection area is connected to a bottom surface of the cavity, and the second surface of the electrically conductive connection area is lower than the first surface of the flexible substrate. In some embodiments, the electrically conductive connection area has a first surface and a second surface opposite the first surface, further wherein the first surface of the electrically conductive connection area is connected to a bottom surface of the cavity, and the second surface of the electrically conductive connection area extends above the first surface of the flexible substrate.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a micro pad array-to-conductive wire flexible attachment assembly. Those of ordinary skill in the art will realize that the following detailed description of a micro-pad array-to-conductive wire flexible attachment assembly is illustrative only and is not intended to be in any way limiting. Other embodiments of a micro-pad array-to-conductive wire flexible attachment assembly will readily suggest themselves to such skilled persons having the benefit of this disclosure.

Reference will now be made in detail to implementations of the micro-pad array-to-conductive wire flexible attachment assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, an electrically conductive wire, or simply "conductive wire", refers to electrically conductive metal wires, threads with an electrically conductive plating finish, electrically conductive polymers or electrically conductive fibers, or the like capable of electrical conductivity.

Figure 1:
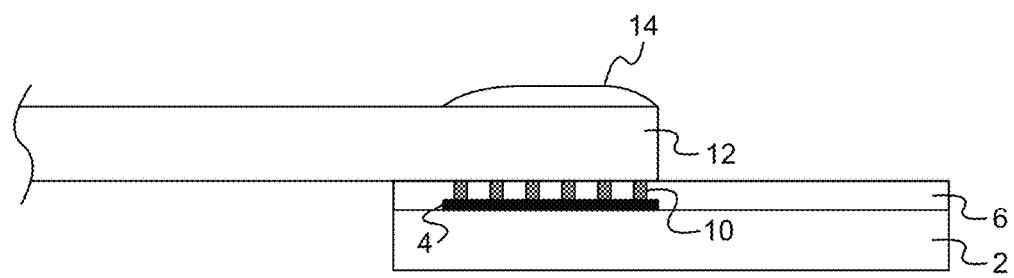
FIG. 1 illustrates a cut-out side view of a micro-pad array-to-conductive wire flexible attachment assembly according to some embodiments.

FIG. 1 illustrates a cut-out side view of a micro-pad array-to-conductive wire flexible attachment assembly according to some embodiments. On an outer surface of a flexible substrate 2 is formed a conductive layer, which is patterned as a connection area 4. In some embodiments, the conductive layer is a metal foil, such as a copper foil, patterned into the size and shape that forms the connection area 4. The metal foil is bonded to a surface of the flexible substrate 2. In some embodiments, the metal foil is bonded to the flexible substrate using a thermo-set adhesive. In other embodiments, adhesive is not used to bond the metal foil to the flexible substrate. Instead, the metal foil can be bonded to the flexible substrate using heat and pressure. In some embodiments, the flexible substrate 2 is a flexible printed circuit (FPC), also referred to as flexible circuit board. The FPC includes a plurality of stacked layers, the layers made of one or more non-conductive layers and one or more conductive layers. The non-conductive layers are made of flexible material. Flexible materials can include, but are not limited to, polyimide, polyethylene teraphthalate (PET), polyethylene nitride (PEN) or polyurethane. The conductive layers are each electrically conductive layers made of a metal, such as copper, that are patterned into electrically conductive traces, or interconnects. In some embodiments, an outer surface of the FPC is a combination of insulating material (non-conductive layer) and conductive interconnects (such as outer layer portion of vias, contact pads/bond pads, conductive traces or other patterned conductive interconnects). The connection area 4 is formed on a portion of the outer surface insulating material. The connection area 4 provides an electrical connection point between one or more interconnects within the FPC and an external element, such as a conductive wire. For simplicity, the flexible substrate 4 is shown in FIG. 1 as a simple block, but is intended to represent a FPC of the type described above.

Figure 2:
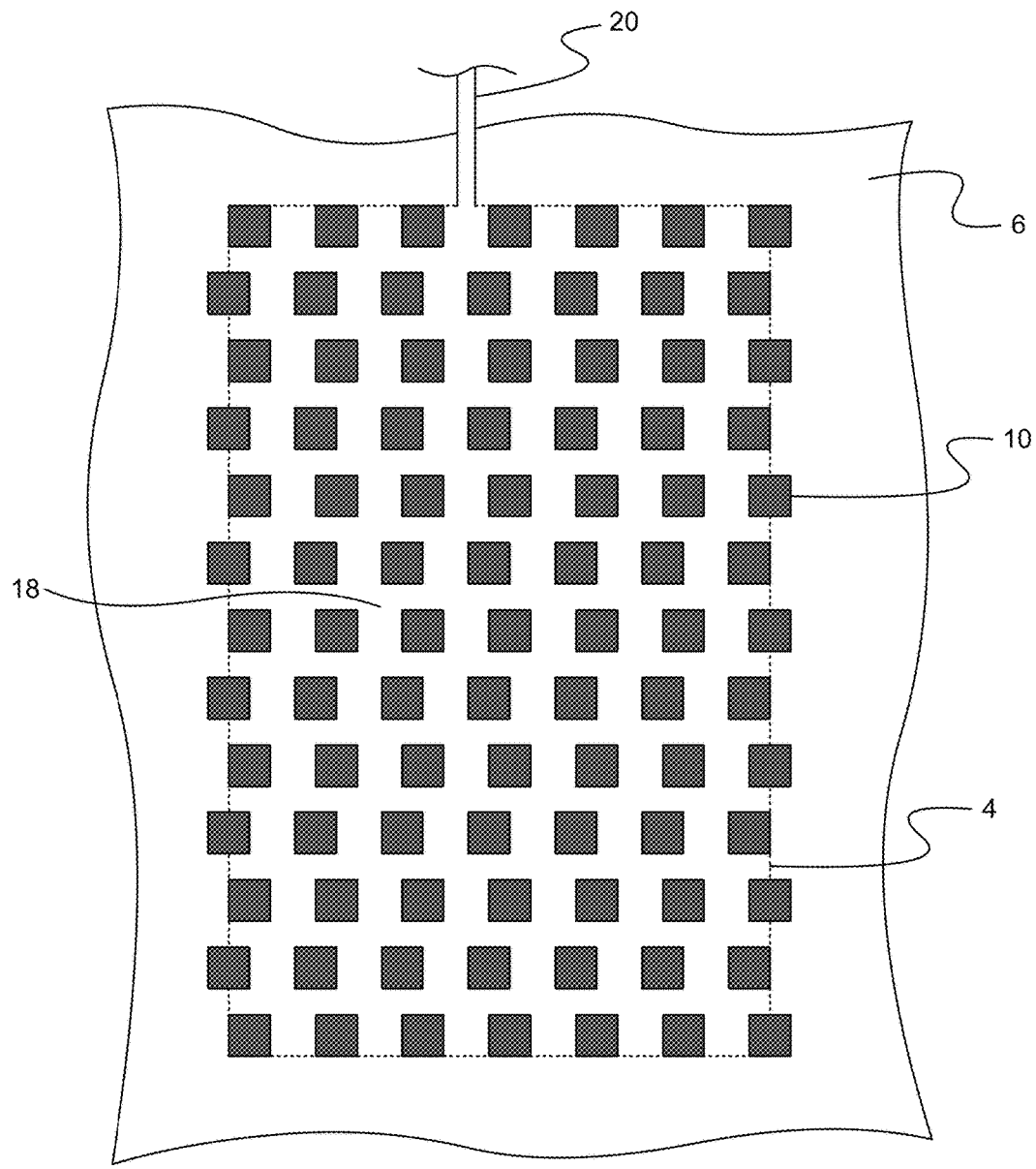
FIG. 2 illustrates a top down view of the connection area and the micro-pads of FIG. 1 according to some embodiments.

An insulating layer 6 is formed over the surface of the flexible substrate 2 and the connection area 4. In some embodiments, the insulating layer is soldermask. Openings are formed through an entire thickness of the insulating layer, the openings are aligned over the connection area 4. The openings are filled with a conductive paste, such as solder paste or anisotropic conductive paste (ACP). Each conductive paste-filled opening forms a micro-pad 10 that is mechanically and electrically connected to the connection area 4. The underlying connection area 4 is an interconnect for all conductive paste in the openings that form the micro-pads 10. The openings, and corresponding micro-pads, can be configured in a grid-like pattern, or array. FIG. 2 illustrates a top down view of the connection area 4 and the micro-pads 10 of FIG. 1 according to some embodiments. The connection area 4 is shown as a dashed line indicating the exemplary shape and position of the connection area 4 underneath the insulating layer 6. An exposed outer surface 18 of the insulating layer 6 is shown both outside the footprint of the connection area 4 and within the footprint of the connection area 4, including in-between the exposed outer surface of each micro-pad 10. An off-pad conductive interconnect 20 is connected to the connection area 4 and provides an external electrical connection. As shown in the exemplary configuration of FIG. 2, the connection area 4 is shaped as a rectangle. It is understood that the connection area 4 can be alternatively shaped. As also shown in the exemplary configuration of FIG. 2, the micro-pads 10 are configured in an off-set array, where each row of micro-pads is offset relative to the adjacent row. It is understood that alternative patterns of micro-pads can be configured. For example, the micro-pads can be aligned from row to row. As other examples, the micro-pads can be arranged asymmetrically, and/or with various numbers of micro-pads from row to row, and/or from column to column.

Returning to FIG. 1, a conductive wire 12 is attached to the array of micro-pads 10. In the exemplary embodiment shown in FIG. 1, the conductive paste fills each opening in the insulating layer 6 so as to be co-planar with an outer surface of the insulating layer. The attachment means for electrically and mechanically attaching the conductive wire to the connection area is an electrically conductive attach material including, but no limited to, solder or an electrically conductive adhesive. The electrically conductive attach material may or may not be same material as the conductive paste that forms the micro-pads. Solder 14, or other electrically conductive adhesive, is applied over and around the conductive wire 12 to mechanically and electrically attach the conductive wire 12 to the micro-pads 10. In other embodiments, each opening in the insulating layer 6 is over-filled with conductive paste, where excess conductive paste is layered over some or all of the outer surface of the insulating layer within the footprint of the connection area 4. In this alternative configuration, the conductive wire 12 is positioned on the micro-pads 10 and excess conductive paste layered over the insulating layer 6, and solder 14 or other conductive adhesive can be applied over the conductive wire 12. Due to the size, shape, and/or position of the conductive wire 12 relative to the micro-pads 10 and the micro-pad array, it is understood that the conductive wire 12 may not be in direct contact with each micro-pad 10 within the micro-pad array. The solder 14, and any excess conductive paste layered on the insulating layer, can provide electrical connection with some or all of the micro-pads 10 not in direct contact with the conductive wire 12.

Figure 3:
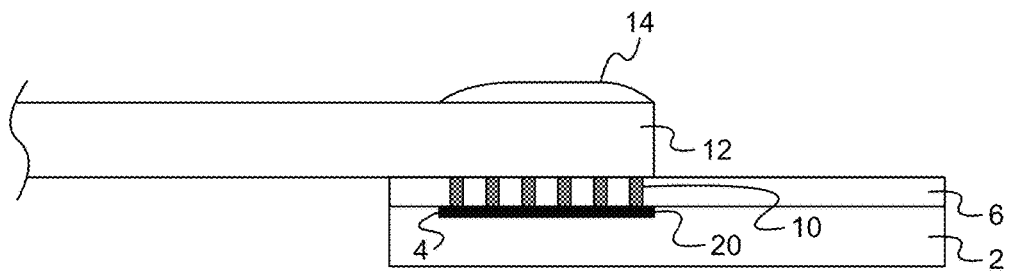
FIG. 3 illustrates a cut-out side view of a micro-pad array-to-conductive wire flexible attachment assembly according to another embodiment.

In some applications it may be desired that the connection area is fully or partially submerged within the flexible substrate. Either a cavity can be formed in the flexible substrate and the metal foil is placed in the cavity, or the metal foil is placed on the surface of an intermediate flexible substrate structure, then another layer of flexible substrate is added with area overlapping the connection area removed. Embedding the connection area may be useful in applications that require varying thicknesses of the flexible substrate and having the metal foil embedded may be more commensurate with a fabrication process that meets such specifications. FIG. 3 illustrates a cut-out side view of a micro-pad array to conductive wire flexible attachment assembly according to another embodiment. The micro-pad array to conductive wire flexible attachment assembly of FIG. 3 is the same as that of FIG. 1 except that a cavity 20 is formed in the flexible substrate, and the connection area 4 is formed within the cavity so that the connection area 4 is submerged within the flexible substrate.

Figure 4:
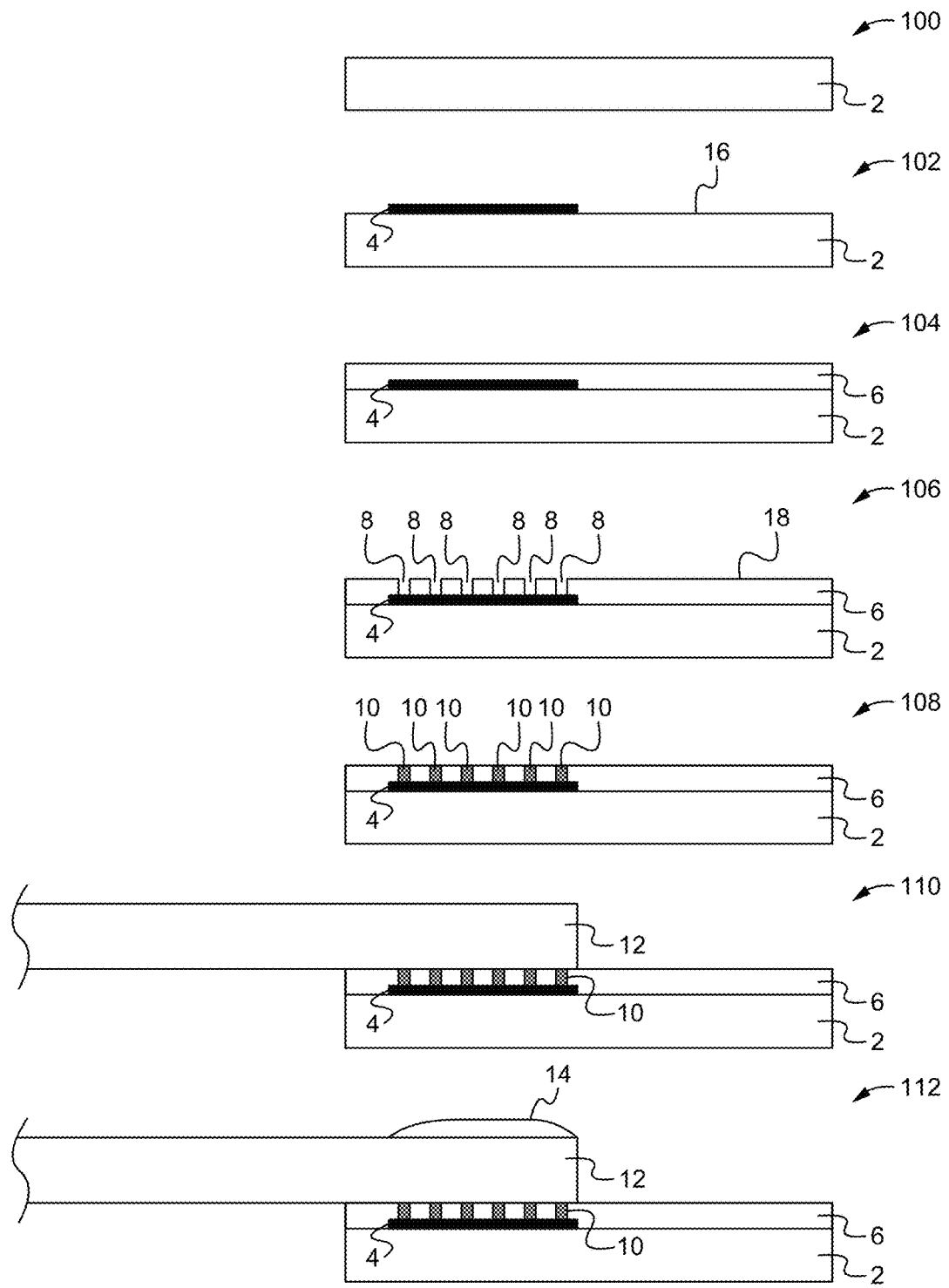
FIG. 4 illustrates a method of fabricating the micro-pad array-to-conductive wire flexible attachment assembly according to some embodiments.

FIG. 4 illustrates a method of fabricating the micro-pad array to conductive wire flexible attachment assembly according to some embodiments. The method shown in FIG. 4 is described in relation to the micro-pad array to conductive wire flexible attachment assembly of FIGS. 1-2. The method shown in FIG. 4 can also be applied to the fabrication of the alternatively configured micro-pad array to conductive wire flexible attachment assembly of FIG. 3. It is understood that the same methodology can be applied to fabricate similar micro-pad array to conductive wire flexible attachment assemblies or that similar methodologies can be used to fabricate the same or similar micro-pad array to conductive wire flexible attachment assemblies as those shown in FIGS. 1-3.

At a step 100, the flexible substrate 2 is provided. In some embodiments, the flexible substrate 2 is a FPC. The FPC includes a plurality of stacked layers, the layers made of one or more non-conductive layers and one or more conductive layers. The connection area 4 provides an electrical connection point between one or more interconnects (not shown) within the FPC.

At a step 102, the connection area 4 is formed on an outer surface 16 of the flexible substrate 2. The connection area 4 is a patterned conductive layer. In some embodiments, the conductive layer is a metal foil, such as a copper foil, patterned into the size and shape that forms the connection area 4. The metal foil is bonded to the surfaces 16 of the flexible substrate 2. In the alternative structure as shown in FIG. 3, a cavity is formed in the flexible substrate 2, and the metal foil is placed in the cavity. Either a cavity can be formed in the flexible substrate and the metal foil is placed in the cavity, or the metal foil is placed on the surface of an intermediate flexible substrate structure, then another layer of flexible substrate is added with area corresponding to the connection area removed. A thickness of the metal foil and a depth of the cavity can be configured such that when the metal foil is positioned within the cavity an exposed top surface of the metal foil is co-planar with the outer surface 16 of the flexible substrate 2, or such the exposed top surface of the metal foil is below, or above, the outer surface 16 of the flexible substrate 2.

At a step 104, insulating layer 6 is formed over the surface 16 of the flexible substrate 2 and the connection area 4. At a step 106, openings 8 are formed through an entire thickness of the insulating layer 6, exposed underlying portions of the connection area 4. The openings 8 are aligned over the connection area 4. The openings 8 can be formed in any desired number and pattern. In some embodiments, the openings are formed using a photolithographic process. It is understood that alternative techniques can be used to form openings in the insulating layer.

At a step 108, the openings 8 are filled with a conductive paste to form micro-pads 10. Each micro-pad 10 is mechanically and electrically connected to the connection area 4. In the embodiment shown in FIG. 3, the conductive paste is applied without excess such that conductive paste fills only the openings 8 in the insulating layer 6 and does not overflow onto the top surface 18 of the insulating layer 6. In this configuration, the conductive paste fills each opening 8 such that an exposed surface of the conductive paste is co-planar with the outer surface 18 of the insulating layer 6. In other embodiments, excess conductive paste is applied so that not only are the openings 8 filled with conductive paste but excess conductive paste is layered over some or all of the outer surface 18 of the insulating layer 6 within the footprint of the connection area 4.

At a step 110, the conductive wire 12 is positioned on the array of micro-pads 10. In the configuration where excess conductive paste is layered over some or all of the outer surface 18, the conductive wire 12 is positioned on the micro-pads 10 and excess conductive paste layered over the insulating layer 6.

At a step 112, solder 14, or other conductive adhesive, is applied over and around the conductive wire 12 within the footprint of the connection area 4 to mechanically and electrically attach the conductive wire 12 to the micro-pads 10. Due to the size, shape, and/or position of the conductive wire 12 relative to the micro-pads 10 and the micro-pad array, it is understood that the conductive wire 12 may not be in direct contact with each micro-pad 10 within the micro-pad array. The solder 14, and any excess conductive paste layered on the insulating layer, can provide electrical connection with some or all of the micro-pads 10 not in direct contact with the conductive wire 12.

Figure 5:
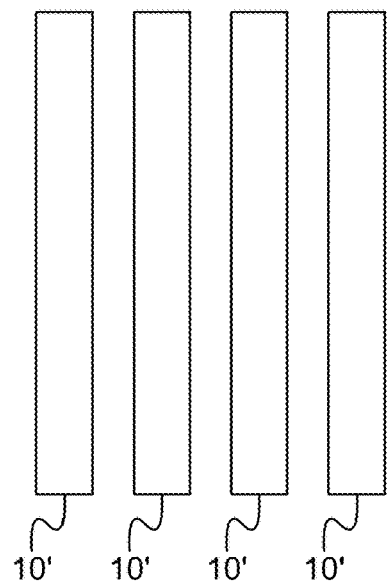
FIG. 5 illustrates a top down view of alternatively shaped micro-pads according to some embodiments.
Figure 6:
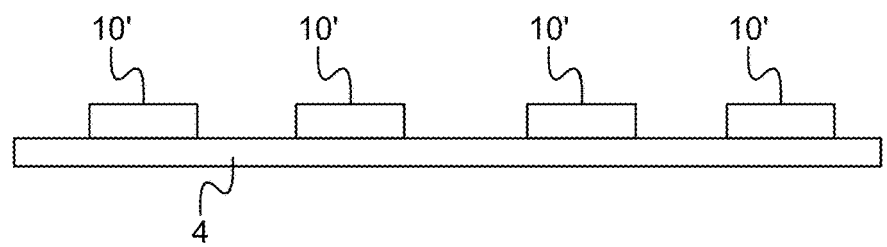
FIG. 6 illustrates a cut-out side view of the micro-pad array of FIG. 5 formed on the contact pad.
Figure 7:
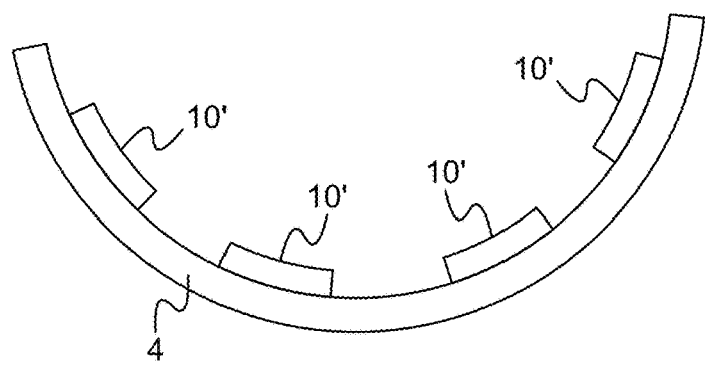
FIG. 7 illustrates the micro-pad array and contact pad of FIG. 6 in a bent position.

The previous embodiment shown in FIG. 2 shows the micro-pads configured, shaped, and arranged as a sequence of rows, each row having a plurality of individual micro-pads. It is understood that the individual micro-pads can be alternatively configured and shaped. FIG. 5 illustrates a top down view of alternatively shaped micro-pads according to some embodiments. Each alternatively shaped micro-pad 10' can be shaped as a strip, and each strip is aligned in parallel with other strips such as shown in FIG. 5. FIG. 6 illustrates a cut-out side view of the micro-pad array of FIG. 5 formed on the contact pad 4. The structure shown in FIG. 6 is simplified for illustrative purposes only and does not show the insulating layer, the flexible substrate, the conductive wire, and the solder as is included in the completed assembly. Configuring the micro-pads as strips is particularly useful for those applications where the flexible substrate is only to be bent along a single axis parallel to the longitudinal axis of the micro-pad strips, such as shown in FIG. 7. Aligning the strips along this single axis increases the contact area between the micro-pad strips and the conductive wire 12.

It is understood that the micro-pads can be configured and shaped differently than that shown in FIGS. 2 and 5. It is also understood that the underlying flexible substrate can be alternatively shaped. For example, the flexible substrate can have a meandering shape, such as a serpentine shape, which enables stretching of the flexible substrate, such as straightening the serpentine shape. In such alternatively shaped configurations, the attached contact pad and micro-pads can be alternatively shaped to also accommodate such stretching. In some embodiments, the flexible substrate and the conductive wire are made of stretchable material to enable stretching of the assembly. It is understood that the use of stretchable materials and the configuration using stretchable shapes can be combined.

The present invention has been described in terms of specific embodiments incorporating details to facilitate the understanding of the principles of construction and operation of the micro-pad array to conductive wire flexible attachment assembly. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A flexible attachment assembly comprising:
   a. a flexible substrate;
   b. an electrically conductive connection area coupled to the flexible substrate;
   c. a plurality of electrically conductive micro-pads, each electrically conductive micro-pad has a first end and a second end opposite the first end, the first end is connected to the electrically conductive connection area such that the electrically conductive connection area electrically interconnects all electrically conductive micro-pads; and
   d. a conductive wire, wherein a portion of the conductive wire is mechanically and electrically coupled to the second ends of the plurality of electrically conductive micro-pads, further wherein a remaining portion of the conductive wire extends beyond a footprint of the flexible substrate.

2. The flexible attachment assembly of claim 1 wherein the flexible substrate comprises one or more non-conductive layers and one or more conductive layers.

3. The flexible attachment assembly of claim 1 wherein the flexible substrate comprises one of polyimide, polyethylene teraphthalate (PET), polyethylene nitride (PEN) or polyurethane.

4. The flexible attachment assembly of claim 1 wherein the flexible substrate comprises a flexible printed circuit.

5. The flexible attachment assembly of claim 1 wherein the electrically conductive connection area comprises a continuous layer of conductive material.

6. The flexible attachment assembly of claim 5 wherein the continuous layer of conductive material comprises a metal foil sheet.

7. The flexible attachment assembly of claim 1 wherein the plurality of electrically conductive micro-pads are made of conductive paste.

8. The flexible attachment assembly of claim 7 wherein the conductive paste comprises one of a solder paste and an anisotropic conductive paste.

9. The flexible attachment assembly of claim 1 wherein each of the plurality of electrically conductive micro-pads is physically separated from each other.

10. The flexible attachment assembly of claim 1 further comprising solder coupled to the portion of the electrically conductive wire and the first end of each of the electrically conductive micro-pads.

11. The flexible attachment assembly of claim 1 further comprising electrically conductive adhesive coupled to the portion of the electrically conductive wire and the first end of each of the electrically conductive micro-pads.

12. The flexible attachment assembly of claim 1 further comprising an insulating layer applied over the flexible substrate and the electrically conductive connection area and in-between the plurality of micro pads extending from the electrically conductive connection area.

13. The flexible attachment assembly of claim 12 wherein the insulating layer comprises soldermask.

14. The flexible attachment assembly of claim 12 wherein an outer surface of the insulating layer is co-planar with an exposed surface of the second end of each micro-pad.

15. The flexible attachment assembly of claim 1 wherein the flexible substrate comprises a first surface and a second surface opposite the first surface, further wherein the electrically conductive connection area is connected to the first surface of the flexible substrate.

16. The flexible attachment assembly of claim 1 wherein the flexible substrate comprises a first surface and a second surface opposite the first surface, further wherein a cavity is formed in the first surface of the flexible substrate and the electrically conductive connection area is positioned within the cavity.

17. The flexible attachment assembly of claim 16 wherein the electrically conductive connection area has a first surface and a second surface opposite the first surface, further wherein the first surface of the electrically conductive connection area is connected to a bottom surface of the cavity, and the second surface of the electrically conductive connection area is co-planar with the first surface of the flexible substrate.

18. The flexible attachment assembly of claim 16 wherein the electrically conductive connection area has a first surface and a second surface opposite the first surface, further wherein the first surface of the electrically conductive connection area is connected to a bottom surface of the cavity, and the second surface of the electrically conductive connection area is lower than the first surface of the flexible substrate.

19. The flexible attachment assembly of claim 16 wherein the electrically conductive connection area has a first surface and a second surface opposite the first surface, further wherein the first surface of the electrically conductive connection area is connected to a bottom surface of the cavity, and the second surface of the electrically conductive connection area extends above the first surface of the flexible substrate.

20. The flexible attachment assembly of claim 1 wherein the portion of the conductive wire is aligned over a footprint of the electrically conductive connection area, and a remaining portion of the conductive wire extends beyond a footprint of the electrically conductive connection area.

21. The flexible attachment assembly of claim 1 wherein the electrically conductive connection area is a single contact pad for the portion of the conductive wire, and the plurality of electrically conductive micro-pads are all connected to the single contact pad.

\* \* \* \* \*